(12) United States Patent
Fukuda et al.

(10) Patent No.: US 9,095,051 B2
(45) Date of Patent: Jul. 28, 2015

(54) CERAMIC SUBSTRATE FOR MOUNTING A DEVICE, CERAMIC SUBSTRATE FOR MOUNTING AN LED, LED LAMP, HEADLIGHT AND ELECTRONIC PARTS

(75) Inventors: Yoshiyuki Fukuda, Ayase (JP); Hiromasa Kato, Nagareyama (JP)

(73) Assignee: Kabushiki Kaisha Toshiba (JP)

( * ) Notice: Subject to any disclaimer, the term of this patent is extended or adjusted under 35 U.S.C. 154(b) by 364 days.

(21) Appl. No.: 13/343,204

(22) Filed: Jan. 4, 2012

(65) Prior Publication Data

US 2012/0098020 A1   Apr. 26, 2012

Related U.S. Application Data

(63) Continuation of application No. PCT/JP2010/061427, filed on Jul. 5, 2010.

(30) Foreign Application Priority Data

Jul. 6, 2009 (JP) .................................. 2009-159961

(51) Int. Cl.
| H01L 33/00 | (2010.01) |
| H05K 1/02 | (2006.01) |
| H05K 1/03 | (2006.01) |

(52) U.S. Cl.
CPC .............. *H05K 1/02* (2013.01); *H05K 1/0306* (2013.01); *H05K 2201/09063* (2013.01); *H05K 2201/09145* (2013.01); *H05K 2201/10106* (2013.01); *H05K 2201/10409* (2013.01); *H05K 2203/167* (2013.01); *Y10T 428/24273* (2015.01)

(58) Field of Classification Search
USPC ...................... 257/98, E33.073, E33.075, 99
See application file for complete search history.

(56) References Cited

U.S. PATENT DOCUMENTS

| 6,110,596 A * | 8/2000 | Kasori et al. .................. 428/428 |
| 2005/0139846 A1 * | 6/2005 | Park et al. ........................ 257/98 |
| 2007/0085101 A1 * | 4/2007 | Kim .................................. 257/98 |
| 2007/0236935 A1 * | 10/2007 | Wang ............................ 362/294 |
| 2008/0315214 A1 * | 12/2008 | Wall et al. ....................... 257/81 |

FOREIGN PATENT DOCUMENTS

| JP | 6-086375 | 12/1994 |
| JP | 06-086375 | 12/1994 |
| JP | 6-086376 | 12/1994 |
| JP | 06-086376 | 12/1994 |
| JP | 2001-237502 A | 8/2001 |
| JP | 2005-056849 | 3/2005 |
| JP | 2007-088272 A | 4/2007 |
| JP | 2008-204844 | 9/2008 |

(Continued)

OTHER PUBLICATIONS

English translation of International Preliminary Report on Patentability for PCT/JP2010/061427 mailed Feb. 23, 2012 (6 pages).

(Continued)

*Primary Examiner* — Timor Karimy

(74) *Attorney, Agent, or Firm* — Harness, Dickey & Pierce, P.L.C.

(57) ABSTRACT

According to one embodiment, a ceramic substrate for mounting a device is provided. The ceramic substrate includes a through-hole and a recessed portion provided on at least one edge surface thereof.

12 Claims, 3 Drawing Sheets (56) References Cited

FOREIGN PATENT DOCUMENTS

| JP | 2008-251663 | 10/2008 |
|---|---|---|
| JP | 2009-087897 | 4/2009 |
| JP | 2009-130204 | 6/2009 |

OTHER PUBLICATIONS

Japanese Office Action for Application No. 2011-521913 mailed Mar. 11, 2014 with English translation (5 pages).
Japanese Office Action for Application No. 2011-521913 dated Jul. 1, 2014 with English translation (4 pages).

* cited by examiner

CERAMIC SUBSTRATE FOR MOUNTING A DEVICE, CERAMIC SUBSTRATE FOR MOUNTING AN LED, LED LAMP, HEADLIGHT AND ELECTRONIC PARTS

CROSS REFERENCE TO RELATED APPLICATIONS

This application is a Continuation Application of PCT Application No. PCT/JP2010/061427, filed Jul. 5, 2010 and based upon and claiming the benefit of priority from prior Japanese Patent Application No. 2009-159961, filed Jul. 6, 2009, the entire contents of all of which are incorporated herein by reference.

FIELD

Embodiments described herein relate generally to a ceramic substrate for mounting devices such as LEDs, and an LED lamp, a headlight and electronic parts using the ceramic substrate.

BACKGROUND

LED lamps using LEDs (light emitting diodes) are used in various fields such as interior lights, and backlights for liquid crystal display devices and the like. Because an LED lamp can reduce power consumption more outstandingly than an electric discharge lamp, cold cathode tube and the like, attempts are being made to apply the LED lamp to various fields. One of typical examples includes automobile lamps. Examples of these automobile lamps include a headlight, side lamp, and back lamp (brake lamp).

For example, a headlight serves to illuminate a wide area with light from an LED by using a reflection plate, diffusion plate, scattering plate and the like. In order to illuminate a wide area with LED light, it is effective to improve reflection efficiency and diffusion efficiency by registering the positions of a reflecting plate, diffusion plate and the like with the position of an LED. Further, a method of raising luminous intensity by mounting a plurality of LEDs is effective (for example, Patent Literature 1). In the meantime, an LED chip is a very small luminous element having a size of about 1 mm×1 mm square. For this, if the positions cannot be exactly registered, satisfactory reflection efficiency and diffusion efficiency cannot be obtained.

Further, LEDs generate heat when they emit light and therefore, there is a demand for a substrate having high heat radiating ability. Moreover, vehicles are, of course, vigorously vibrated and it is therefore desired to take anti-vibration measures to protect a head lamp to be mounted thereon. For example, a resin substrate has low strength and therefore needs a reinforcing member.

Further, Patent Literature 2 discloses anti-vibration measures using a heat pipe having a first bending section and a second bending section. Vibration can be absorbed by using such a heat pipe. However, a heat pipe having such a complex form with the first and second bending sections is required, which is a cause of cost-up.

Further, position registration is also important for semiconductor devices and solar cell devices besides LED chips. A deviation of the mounting position of a device on a substrate is a cause of defects of electronic parts.

CITATION LIST

Patent Literature

Patent Literature 1: Jpn. Pat. Appin. KOKAI Publication No. 2005-56849
Patent Literature 2: Jpn. Pat. Appin. KOKAI Publication No. 2008-204844

DETAILED DESCRIPTION

An object of the embodiments is to provide a ceramic substrate for mounting an LED, the ceramic substrate being able to make LED chips to be easily registered and having high strength, and provide an LED lamp and a headlight using the ceramic substrate.

Further, an object of the embodiments is to provide a ceramic substrate for mounting a device, the ceramic substrate improved in position registration of devices, and provide an electronic part using the ceramic substrate.

In general, according to one embodiment, a ceramic substrate for mounting an LED includes a through-hole and a recessed portion provided on at least one edge surface thereof.

An LED lamp according to an embodiment includes a ceramic substrate and a light emitting diode mounted on the ceramic substrate. The ceramic substrate includes a through-hole and a recessed portion provided on at least one edge surface thereof.

A headlight according to an embodiment includes an LED lamp. The LED lamp includes a ceramic substrate and a light emitting diode mounted on the ceramic substrate. The ceramic substrate includes a through-hole and a recessed portion provided on at least one edge surface thereof.

A ceramic substrate according to an embodiment is a ceramic substrate for mounting at least one type of device selected from the group consisting of a semiconductor device and a solar cell device. The ceramic substrate includes a through-hole and a recessed portion provided on at least one edge surface thereof.

An electronic part according to an embodiment includes a ceramic substrate and at least one device. The at least one device is mounted on the ceramic substrate and selected from the group consisting of a semiconductor device and a solar cell device. The ceramic substrate includes a through-hole and a recessed portion provided on at least one edge surface thereof.

First, a ceramic substrate for mounting an LED will be explained.

A ceramic substrate comprising a through-hole and a recessed portion provided on at least one edge surface thereof ensures easy position registration of a substrate because the recessed portion can be fitted in a convex portion (for example, a screw portion) formed on a packaged substrate when the ceramic substrate is secured to the packaged substrate to be used for a headlight. As a result, a position deviation between an LED (light emitting diode) mounted on the ceramic substrate and a cover with a lens function which is used for a headlight or the like can be reduced, and therefore, diffusion efficiency can be improved, so that the luminous intensity of an LED lamp and hence the visibility of the headlight can be improved.

Further, because the ceramic substrate has high mechanical strength, breakage of a substrate can be prevented when the substrate is screwed onto a packaged substrate of, for example, a headlight or when vibration of, for example, a vehicle is applied.

Examples of the ceramic substrate may include a silicon nitride substrate, aluminum nitride (ALN) and alumina. Because the ALN substrate has high heat conductivity, it is superior in heat radiation ability. On the other hand, the silicon nitride substrate is scarcely broken when it is screwed down because it has high toughness (fracture toughness: 6 MPa·m$^{1/2}$ or more). Further, the silicon nitride substrate is reduced in such a disorder that it is broken by vibration, as compared with an ALN substrate. Therefore, the substrate can be prevented from breaking even if the plate thickness of the substrate is reduced, and a more miniature and light-weight LED-mounting substrate can be attained while it has the same heat radiation ability as the ALN substrate.

In this case, the fracture toughness is calculated by the Niihara method using a Niihara equation shown by the following equation (1).

$$\text{Niihara equation} = 0.0114 E^{0.4} P^{0.6} a^{-0.7} (C/a - 1)^{-0.5} \quad (1)$$

where P is a load (Kgf), d is a diagonal length of an indentation (mm), E is Young's modulus (Kgf/mm$^2$), C is the length of a crack from the center point of the indentation (mm), and a is ½ of the diagonal length of the indentation (mm).

The ceramic substrate desirably has a mechanical strength of 500 MPa or more in terms of 3-point bending strength at ambient temperature. Breakage when the ceramic substrate is screwed down can be prevented. The 3-point bending strength is more preferably 600 MPa or more.

When a silicon nitride substrate is used as the ceramic substrate, the plate thickness of the silicon nitride substrate is preferably 0.2 mm to 1 mm. When the plate thickness is 0.2 mm or more, the breakage of the substrate when the substrate is screwed down can be prevented. Further, when the plate thickness is 1 mm or less, a high radiation ability can be obtained.

The silicon nitride substrate preferably has a heat conductivity of 60 W/m·K or more and a 3-point bending strength of 600 MPa or more at ambient temperature. Such a substrate is scarcely broken when it is screwed down and is superior in heat radiation ability.

The ceramic substrate for mounting an LED may comprises a circuit section. An LED is packaged in the circuit section. The circuit section may be formed from, for example, a metal circuit board produced by bonding a copper plate or Al plate, or a thin film circuit layer provided with a metal thin film. The ceramic substrate to which a copper circuit board is bonded is superior in the strength against vibration. The copper circuit board can be bonded, for example, by the active metal bonding method or direct bonding method (DBC method).

The ceramic substrate may comprise a reflection layer that reflects the light from an LED in a region where no circuit section is formed on the surface of the substrate mounting the circuit section. The reflection layer is preferably an inorganic white film of a silicon oxide film or titanium oxide film or an organic white film of an organic resist in the case of white light, though no particular limitation is imposed on it insofar as it reflects the light from an LED. Further, the film thickness of the reflection layer is preferably 100 μm or less. When the film thickness of the reflection layer is made to be 100 μm or less, a reduction in the heat conductivity of the substrate due to the reflection layer can be limited, making it possible to maintain the heat radiation ability of the substrate. The film thickness of the reflection layer is more preferably in a range from 20 μm to 50 μm.

The embodiments will now be explained with reference to FIGS. 1 to 3.

Figure 1:
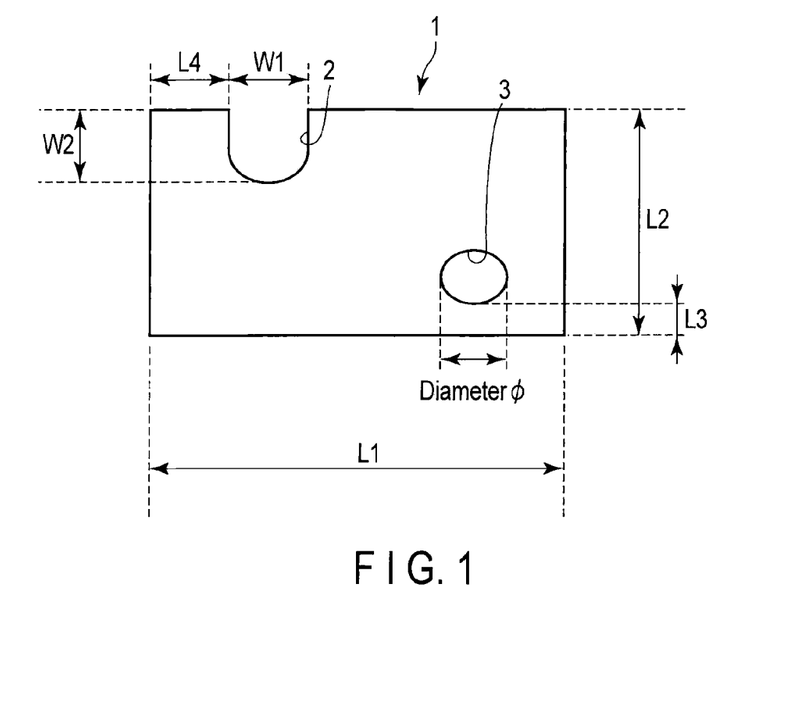
FIG. 1 is a plan view of a ceramic substrate for mounting an LED according to an embodiment.
Figure 2:
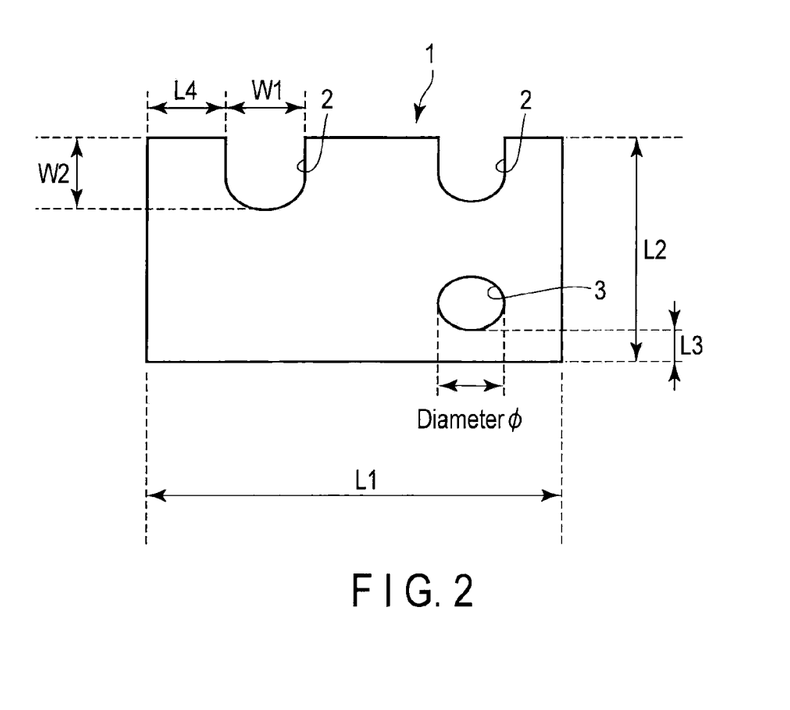
FIG. 2 is a plan view of a ceramic substrate for mounting an LED according to another embodiment.

FIG. 1 is a plan view of a ceramic substrate for mounting an LED according to an embodiment. A ceramic substrate for mounting an LED 1 (hereinafter referred to as a substrate 1) is provided with one recessed portion 2 open on one long edge surface and one through-hole 3 located in the vicinity of another long edge.

With regard to the size of the substrate 1, though no particular limitation is imposed on the size, the length of one edge is desirably 10 mm to 200 mm. As to the length of each edge, all edges may have the same length within a range from 10 mm to 200 mm though each length of the long edge L1 and short edge L2 may be 10 mm to 200 mm as illustrated in FIG. 1.

The diameter φ of the through-hole 3 is desirably 1 mm to 5 mm to secure an area for installment of the circuit section though it varies with the size of a screw used for fastening.

Though the size of the recessed portion 2 varies with the size of a screw used for fastening, it is desirable that the width W1 be 1 mm to 5 mm and the depth W2 be 1 mm to 5 mm to secure an area for installment of the circuit section. Here, the width W1 is the maximum length among the lengths of the recessed portions 2, and the lengths of the recessed portions 2 are parallel to one edge of the substrate. The depth W2 is the maximum distance among the distances from one edge of the substrate to the inside wall of the recessed portion 2.

The minimum distance L3 from the through-hole 3 to one edge of the substrate and the minimum distance L4 from the recessed portion 2 to one edge of the substrate are respectively desirably 1 mm or more. Damage such as breakdown of the substrate when a screw is used for fastening can be thereby avoided.

The numbers of the recessed portions 2 and through-holes 3 formed on the substrate 1 may be respectively one or two or more. When plural recessed portions 2 or through-holes 3 are formed, a plurality of them may be formed on one edge of the substrate 1 or there may be one on each edge. For example, as illustrated in FIG. 2, a plurality of recessed portions 2 may be formed on one long edge of the substrate 1.

Examples of the applications of an LED lamp in which an LED (light emitting diode) is mounted on the LED-mounting ceramic substrate of this embodiment include those mounted on vehicles. The LED lamp is particularly suitable for headlights. An embodiment of a headlight is shown in FIG. 3. In this case, the same members explained with reference to FIG. 1 are designated by the same signs and explanations of these members are omitted.

Figure 3:
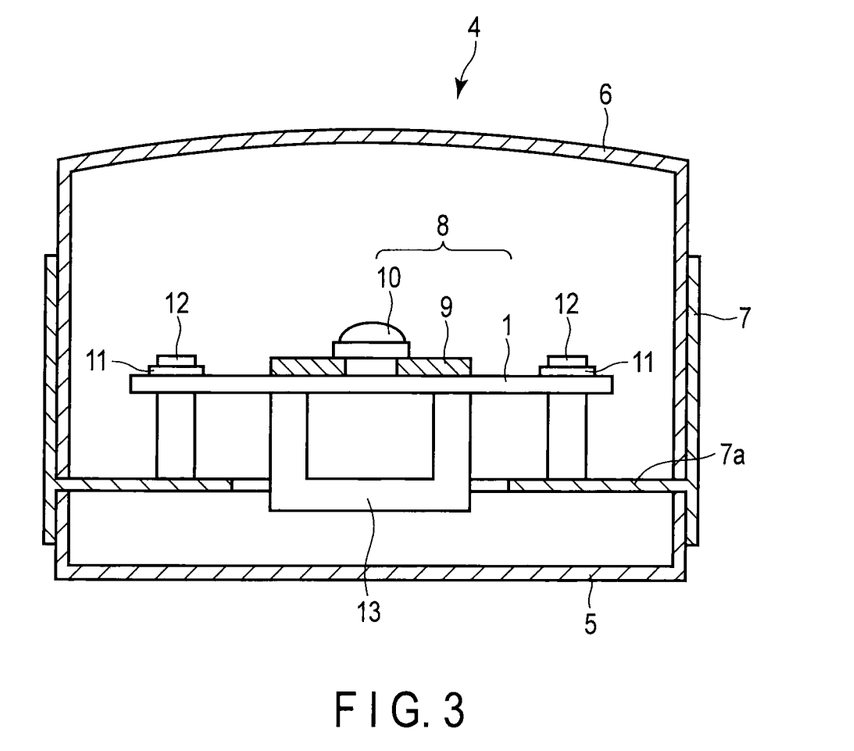
FIG. 3 is a schematic view showing a headlight according to an embodiment.

As shown in FIG. 3, a headlight 4 comprises a tray-like stem 5, a cover 6 having a lens function, a holder 7 for folding the stem 5 and cover 6, and an LED lamp 8. The holder 7 has a cylinder form and the inside thereof is divided by a support plate (substrate to which an LED lamp is secured) 7a. The stem 5 is inserted into and secured to the lower part under the support plate 7a.

The LED lamp 8 comprises a substrate 1 shown in FIG. 1, a circuit section 9 bonded to the substrate 1 and an LED chip 10 bonded to the circuit section 9. The substrate 1 is secured to the support plate 7a of the holder 7 by a screw 12 inserted into each of the recessed portion 2 and through-hole 3 of the substrate 1 through a washer 11 which is a spacer member.

The member represented by the sign 13 in FIG. 3 is a substrate fixing member. Because the substrate fixing member is required to have a substrate-fixing role and heat radiation ability, it is desirably made of aluminum (or aluminum alloy).

The cover 6 having a lens function has an almost square form or circular form in plan shape as viewed from above, and also, the front part of the cover 6 projects externally. The cover 6 is inserted into the upper part above the support plate 7*a* of the holder 7 and secured, and the LED lamp 8 is disposed in a space enclosed by the support plate 7*a* and the cover 6.

The headlight 4 having such a structure ensures that the substrate 1 can be prevented from breaking when the substrate 1 is screwed onto the support plate 7*a* of the holder 7, and also, the breakage of the substrate 1 caused by the vibration of vehicles and the like can be avoided. Further, the position of the substrate 1 can be registered by fitting a screw 12 in the recessed portion 2 of the substrate 1, making it easy to perform the position registration between the cover 6 and the LED chip 10. Therefore, the diffusion efficiency can be improved and the luminous intensity of the LED lamp 8 and hence the visibility of the headlight can be improved.

Though the number of LED chips 10 is designed to be one in the above FIG. 3, two or more of the LED chips 10 may be formed. Further, because the silicon nitride substrate has high strength, the screw fastening torque can be increased to 20 N·m or more. For this, this silicon nitride substrate is preferable as a headlight substrate requiring firm fixing. Particularly, the silicon nitride substrate can maintain strength of 600 MPa or more even if it is provided with a through-hole and a recessed portion and is therefore preferable.

Further, though the above explanations are furnished as to an example in which an LED chip is mounted on the ceramic substrate, positions of devices in electronic parts can be registered simply and with high accuracy by mounting devices such as semiconductor devices or solar cell devices on the ceramic substrate of the embodiment. Specifically, the ceramic substrate of the embodiment is superior in position registration of devices. Further, the effect of increasing the screw fastening torque is obtained similarly to the case of using LED chips by using a silicon nitride substrate as the ceramic substrate. Accordingly, the generation of defects of electronic parts can be reduced by using the ceramic substrate of the embodiment for various electronic parts such as semiconductor devices and solar cell devices.

Figure 5:
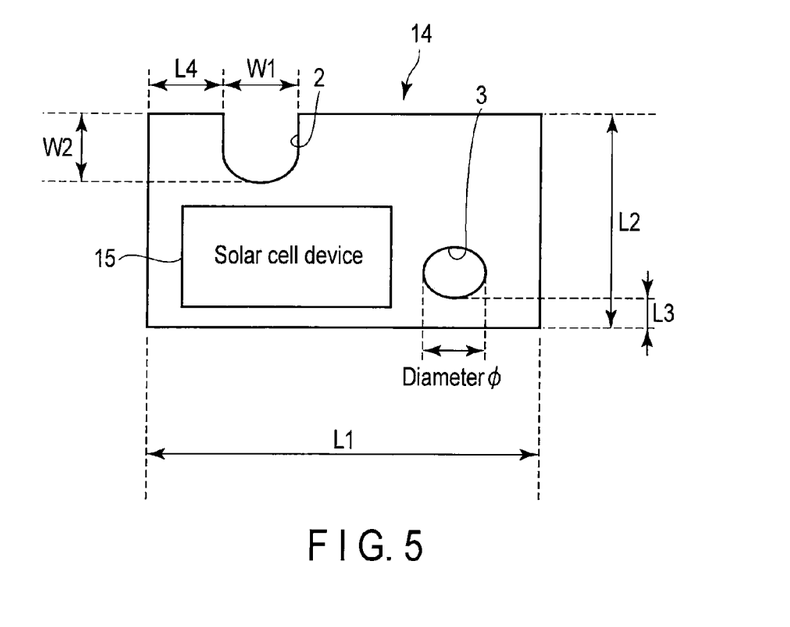
FIG. 5 is a plan view showing an electronic part according to an embodiment.

FIG. 5 shows an embodiment of an electronic part in which a solar cell device is mounted on the ceramic substrate shown in FIG. 1. The same members as those explained in FIG. 1 are designated by the same signs and explanations of these members are omitted here. A ceramic substrate 14 for mounting a device comprises one recessed portion 2 open on one long edge surface and one through-hole 3 positioned in the vicinity of another long edge surface. A solar cell device 15 is mounted on the ceramic substrate 14 for mounting devices.

Using such a structure in electronic parts ensures that the substrate 14 can be registered by fitting the recessed portion 2 of the substrate 14 with a convex portion (for example, a screw portion) formed on the electronic part and therefore the substrate 14 is easily registered. The position deviation of the solar cell device 15 in an electronic part can be thereby reduced. As a result, the generation of defects in electronic parts caused by the contact of the solar cell device 15 with other parts can be reduced. Further, because it is unnecessary to provide a space surplus in an electronic part in consideration of position deviation, the volume efficiency of the electronic part can be improved.

The number of devices to be mounted on the ceramic substrate may be two or more. Further, a solar cell device and a semiconductor device may be both mounted on the ceramic substrate.

EXAMPLES

Examples 1 to 5

A recessed portion 2 and a through-hole 3 as shown in FIG. 1 were formed on a ceramic substrate 1 by punching processing. The diameter ($\phi$) of the through-hole, the minimum distance L3 (mm) between the through-hole 3 and one edge of the substrate, the width W1 (mm) and depth W2 (mm) of the recessed portion 2 and the minimum distance L4 (mm) between the recessed portion 2 and one edge of the substrate are shown in the following Table 1.

Comparative Examples 1 and 2

A ceramic substrate was prepared in which neither a recessed portion nor a through-hole was formed.

The material of the ceramic substrate used in each of the above examples and comparative examples, 3-point bending strength (MPa) at ambient temperature, heat conductivity (W/m·K), fracture toughness (MPa·m$^{1/2}$), and size (length (L2)×width (L1)×thickness (mm)) are shown in the following Table 1. The 3-point bending strength was measured according to JIS-R-1601. Further, the heat conductivity was measured by the laser flash method. The fracture toughness was calculated by the above Niihara equation according to the micro-indication method of JIS-R-1607.

TABLE 1

| | Material | 3-point bending strength (MPa) | Heat conductivity (W/m · K) | Fracture toughness (MPa · m$^{1/2}$) | Size of a ceramics substrate (length (L2) × width (L1) × thickness (mm)) |
|---|---|---|---|---|---|
| Example 1 | Silicon nitride | 800 | 70 | 6.7 | 50 × 30 × 0.32 |
| Example 2 | Silicon nitride | 700 | 95 | 7.2 | 100 × 80 × 0.32 |
| Example 3 | Silicon nitride | 700 | 90 | 7.1 | 150 × 150 × 0.32 |
| Example 4 | AlN | 520 | 170 | 3.8 | 50 × 30 × 0.635 |
| Example 5 | Alumina | 550 | 20 | 4.5 | 50 × 30 × 0.635 |
| Comparative Example 1 | Silicon nitride | 600 | 70 | 6.0 | 50 × 30 × 0.635 |
| Comparative Example 2 | Alumina | 350 | 20 | 4.0 | 50 × 30 × 0.635 |

TABLE 1-continued

|  | Diameter of a through-hole (mm) | Minimum distance between the through-hole and one edge of the substrate (L3) (mm) | Size of the recessed portion (width (W1) × depth (W2)) (mm) | Minimum distance between the recessed portion and one edge of the substrate (L4) (mm) |
| --- | --- | --- | --- | --- |
| Example 1 | 2 | 2 | 2 × 2 | 2 |
| Example 2 | 2 | 1.5 | 2 × 2 | 2 |
| Example 3 | 2 | 1 | 2 × 2 | 1 |
| Example 4 | 2 | 2 | 2 × 2 | 2 |
| Example 5 | 2 | 2 | 2 × 2 | 2 |
| Comparative Example 1 | None | — | None | — |
| Comparative Example 2 | None | — | None | — |

A copper circuit board (15 (length)×15 (width)×0.6 mm (thickness)) was bonded with each of the ceramic substrate of Examples 1 to 5 and Comparative Examples 1 and 2 by using an Ag—Cu—Ti active metal solder material. A back copper plate was bonded to the ceramic substrate to prevent warpage.

Using each circuit board, a step of packaging LED chips at predetermined positions of the copper circuit board to prepare an LED lamp was carried out. In the packaging step, the LED chips were bonded onto the copper plate by Au—Sn soldering.

Next, each LED lamp of Examples 1 to 5 was secured to the packaged substrate by screw-fastening to produce a headlight. In the screw-fastening step, the LED lamp was screw-fastened at two places, the through-hole and the recessed portion, using a screw having a diameter of 1.9 mm and a washer having an outside diameter of 3 mm. The screw-fastening torque was 25 N·m.

Figure 4:
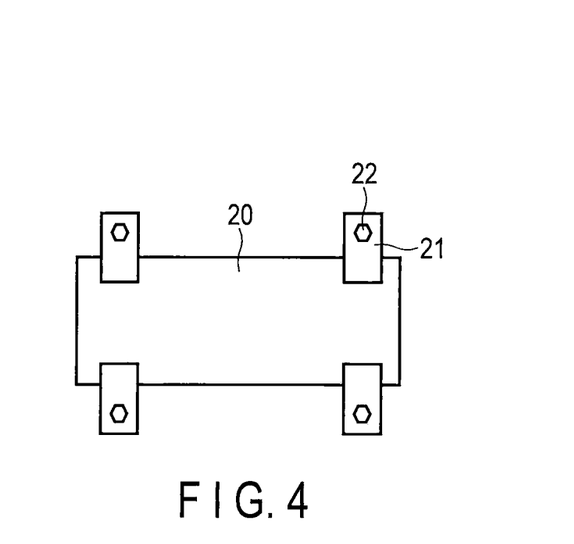
FIG. 4 is a schematic view showing a ceramic substrate for mounting an LED in a comparative example.

On the other hand, as shown in FIG. 4, each LED lamp of Comparative Examples 1 and 2 was secured by screw-fastening the four corners of the substrate 20 by using a screw 22 through a fixing jig 21. The screw-fastening torque was made to be the same as that in the example.

The ratio of broken substrates and the ratio of position deviations, when screw-fastening each substrate, were measured. The results are shown in Table 2.

TABLE 2

|  | Ratio of broken substrates | Ratio of position deviations |
| --- | --- | --- |
| Example 1 | 0% | 0.2% |
| Example 2 | 0% | 0.2% |
| Example 3 | 0% | 0.1% |
| Example 4 | 2% | 0.2% |
| Example 5 | 1% | 0.2% |
| Comparative Example 1 | 8% | 30% |
| Comparative Example 2 | 20% | 30% |

As is clear from Table 2, each ceramic substrate according to Examples 1 to 5 was scarcely broken and also, the number of generations of position deviation was small. In Examples 1 to 3 each using a ceramic substrate made of silicon nitride in particular, the substrate was not broken at all. On the other hand, Comparative Examples 1 and 2 each have a type of structure in which four corners were secured, and therefore, the number of generations of position deviation was large.

Further, as to the breakage of the substrate, the probability that the substrate was broken was increased when torque was applied to the four places.

Examples 6 to 10

The same substrate as that used in Example 2 (silicon nitride substrate) or Example 5 (alumina substrate) was prepared except that L3 and L4 were changed to those shown in Table 3, and the same measurement was made. The results are shown below.

TABLE 3

|  | Substrate | L3 (mm) | L4 (mm) | Ratio of broken substrates | Ratio of position deviations |
| --- | --- | --- | --- | --- | --- |
| Example 6 | Example 2 | 2 | 2 | 0% | 0.2% |
| Example 7 | Example 2 | 2 | 1 | 0% | 0.2% |
| Example 8 | Example 2 | 3 | 2 | 0% | 0.2% |
| Example 9 | Example 5 | 1 | 2 | 3% | 0.2% |
| Example 10 | Example 5 | 3 | 3 | 0% | 0.2% |

It is found that if the substrate has high strength and toughness like the silicon nitride substrate, breakage of the substrate can be prevented if the through-hole and the recessed portion were each located 1 mm or more apart from the edge (L3 and L4 are each 1 mm or more). It is also found that when an alumina substrate has a weak substrate strength, on the other hand, the through-hole and the recessed portion were each preferably located 2 mm or more apart from the edge (L3 and L4 are each 2 mm or more). Accordingly the through-hole and recessed portion can be located nearer to the edge in the case of the silicon nitride substrate so that the silicon nitride substrate can be increased in the area for bonding a copper plate, i.e., in the freedom of bonding position. The increase in the area for bonding a copper plate, i.e., the freedom of the bonding position of a copper plate enables a plurality of LED chips to be mounted on a ceramic substrate.

Examples 11 to 16

The ceramic substrate was altered to those shown in Table 4 to make the same measurement. As the screw for the screw fastening, a screw having a diameter smaller by 0.1 mm than the diameter of the diameter of the through-hole or the diameter of the recessed portion was used. Further, the screw-fastening torque was made to be the same as in Example 1.

TABLE 4

| | Material | 3-point bending strength (MPa) | Heat conductivity (W/m·K) | Fracture toughness (MPa·m$^{1/2}$) | Size of a ceramics substrate (length (L2) × width (L1) × thickness (mm)) | Diameter of a through-hole (mm) | Minimum distance between the through-hole and one edge of the substrate (L3) (mm) | Size of the recessed portion (width (W1) × depth (W2)) (mm) | Minimum distance between the recessed portion and one edge of the substrate (L4) (mm) |
|---|---|---|---|---|---|---|---|---|---|
| Example 11 | Silicon nitride | 700 | 90 | 7.1 | 100 × 100 × 0.32 | 1 | 5 | 2 × 2 | 5 |
| Example 12 | Silicon nitride | 720 | 92 | 7.1 | 100 × 80 × 0.32 | 3 | 0.3 | 2 × 2 | 0.3 |
| Example 13 | Silicon nitride | 650 | 93 | 7.2 | 200 × 170 × 0.32 | 5 | 1 | 2 × 2 | 1 |
| Example 14 | Alumina | 500 | 170 | 3.0 | 50 × 20 × 0.635 | 1 | 8 | 1 × 1 | 8 |
| Example 15 | Alumina | 550 | 30 | 3.1 | 80 × 50 × 0.635 | 1 | 4 | 1 × 1 | 2 |
| Example 16 | Alumina | 550 | 70 | 2.9 | 150 × 100 × 0.635 | 2 | 0.4 | 2 × 2 | 0.4 |

TABLE 5

| | Ratio of broken Substrates | Ratio of position deviations |
|---|---|---|
| Example 11 | 0% | 0.1% |
| Example 12 | 3% | 0.2% |
| Example 13 | 0% | 0.2% |
| Example 14 | 1% | 0.2% |
| Example 15 | 1% | 0.2% |
| Example 16 | 5% | 0.2% |

Figure 6:
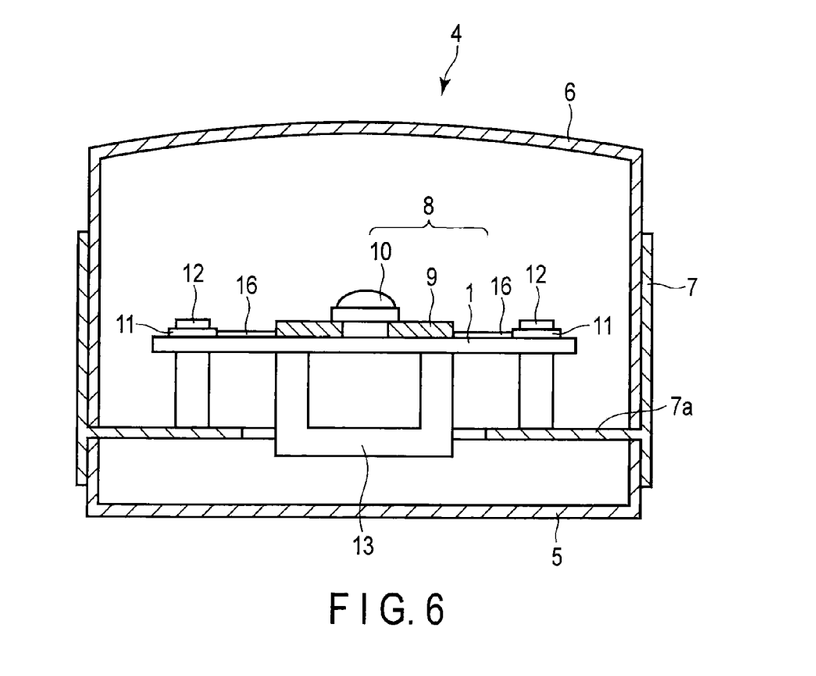
FIG. 6 is a schematic view showing a headlight according to another embodiment.

It is found from Table 5 that the ratio of broken substrates was increased in Examples 12 and 16 in which L3 and L4 were respectively less than 1 mm. L3 and L4 are respectively preferably 1 mm or more. It is also found that the ceramic substrate according to this embodiment exhibits excellent characteristics according to various sizes except for the above limitation to the lengths of L3 and L4. Specifically, a through-hole having a diameter and a recessed portion having a size in accordance with the size of a screw can be formed, ensuring that the ceramic substrate according to this embodiment can be applied to various LED lamps increased in the number of LEDs and further to headlights. Further, as shown in FIG. 6, a reflection layer 16 made of, for example, a white film is formed in an area where no circuit section is formed, thereby making it possible to improve luminous intensity, which also improves the characteristics required for a lamp. In FIG. 6, the same members as those shown in FIG. 3 are designated by the same signs and explanations of these parts are omitted.

Further, even in the case of mounting a semiconductor device (semiconductor device other than an LED chip) or a solar cell device in place of the LED chip, the same effect as that of, for example, the registration ability is obtained. Therefore, the embodiment is suitable not only for a headlight but also for various electronic parts.

According to the embodiments, a ceramic substrate for mounting an LED can be provided which is characterized by the feature that LED chips are easily registered and the substrate has high strength, and an LED lamp and a headlight using the ceramic substrate can be provided.

Further, according to the embodiments, a ceramic substrate for mounting devices improved in position registration of devices and an electronic part using the ceramic substrate can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A ceramic substrate for mounting an LED, the ceramic substrate comprising a through-hole for screw-fastening and a recessed portion for screw-fastening or position registration and which is provided on at least one edge surface of a circumference thereof, and
wherein the ceramic substrate is a silicon nitride substrate having a plate thickness of 0.2 mm to 1 mm, a heat conductivity of 60 W/m·K or more and a 3 point bending strength of 600 MPa or more at ambient temperature,
wherein the through-hole has a diameter of 1 mm to 5 mm, and a minimum distance from the through-hole to one edge of the ceramic substrate is 1 mm or more, and
wherein a ratio of broken ceramic substrate is 5% or less when a screw fastening torque of 25 N·m is applied to the ceramic substrate.

2. The ceramic substrate according to claim 1, the substrate further comprising a circuit section.

3. The ceramic substrate according to claim 1, the substrate having a length of one edge of 10 mm to 200 mm.

4. The ceramic substrate according to claim 1, wherein the recessed portion has a width of 1 mm to 5 mm and a depth of 1 mm to 5 mm.

5. The ceramic substrate according to claim 1, wherein a minimum distance from the recessed portion to one edge of the substrate is 1 mm or more.

6. An LED lamp comprising the ceramic substrate as claimed in claim 1 and a light-emitting diode mounted on the ceramic substrate.

7. The LED lamp according to claim 6, the LED lamp comprising two or more of the light-emitting diodes.

8. The LED lamp according to claim 6, the lamp being used for a vehicle.

9. The LED lamp according to claim 6, the lamp being used for a headlight.

10. A headlight comprising the LED lamp as claimed in claim 6.

11. The headlight according to claim 10, the headlight comprising:
   a substrate to which the LED lamp is secured; and
   a cover with a lens function which is secured to the substrate and cover the LED lamp,
   wherein the LED lamp is secured to the substrate by screw-fastening the through-hole and recessed portion of the ceramic substrate onto the substrate.

12. An electronic part comprising:
   a ceramic substrate having two elongated edges opposite to each other;
   one of the edges having a recess therein, the recess being defined by walls of the substrate while leaving an outer portion of the recess open;
   the other edge having a through hole adjacent to it;
   at least one device mounted on a major surface of the ceramic substrate, the device being selected from the group of light emitting diodes, semiconductor devices and solar cells;
   a housing member;
   a first screw located in the recess for fastening the ceramic substrate to the housing member;
   a second screw located in the through hole for fastening the ceramic substrate to the housing member;
   wherein the ceramic substrate is a silicon nitride substrate having a plate thickness of 0.2 mm to 1 mm, a heat conductivity of 60 W/m·K or more and a 3-point bending strength of 600 MPa or more at ambient temperature,
   wherein the through-hole has a diameter of 1 mm to 5 mm, and a minimum distance from the through-hole to one edge of the ceramic substrate is 1 mm or more, and
   wherein a ratio of broken ceramic substrate is 5% or less when a screw fastening torque of 25 N·m a applied to the ceramic substrate.

* * * * *

UNITED STATES PATENT AND TRADEMARK OFFICE
CERTIFICATE OF CORRECTION

PATENT NO.       : 9,095,051 B2
APPLICATION NO.  : 13/343204
DATED            : July 28, 2015
INVENTOR(S)      : Yoshiyuki Fukuda and Hiromasa Kato

It is certified that error appears in the above-identified patent and that said Letters Patent is hereby corrected as shown below:

On the title page, item (73) Assignee should read as follows:

--(73) Assignees: Kabushiki Kaisha Toshiba (JP);

Toshiba Materials Co., Ltd. (JP)

Signed and Sealed this
Eighth Day of March, 2016

Michelle K. Lee
*Director of the United States Patent and Trademark Office*